(12) United States Patent
Lipson et al.

(10) Patent No.: US 12,189,310 B2
(45) Date of Patent: Jan. 7, 2025

(54) SYSTEMS AND METHODS FOR MANUFACTURING A DOUBLE-SIDED ELECTROSTATIC CLAMP

(71) Applicant: ASML Holding N.V., Veldhoven (NL)

(72) Inventors: Matthew Lipson, Stamford, CT (US); Mehmet Ali Akbas, Cheshire, CT (US)

(73) Assignee: ASML HOLDING N.V., Veldhoven (NL)

( * ) Notice: Subject to any disclaimer, the term of this patent is extended or adjusted under 35 U.S.C. 154(b) by 126 days.

(21) Appl. No.: 17/790,341

(22) PCT Filed: Dec. 4, 2020

(86) PCT No.: PCT/EP2020/084727
§ 371 (c)(1),
(2) Date: Jun. 30, 2022

(87) PCT Pub. No.: WO2021/136628
PCT Pub. Date: Jul. 8, 2021

(65) Prior Publication Data
US 2023/0021360 A1    Jan. 26, 2023

Related U.S. Application Data

(60) Provisional application No. 62/965,101, filed on Jan. 23, 2020, provisional application No. 62/955,489, filed on Dec. 31, 2019.

(51) Int. Cl.
*G03F 7/20* (2006.01)
*C03C 27/00* (2006.01)
(Continued)

(52) U.S. Cl.
CPC .......... *G03F 7/70708* (2013.01); *C03C 27/00* (2013.01); *H01L 21/6833* (2013.01)

(58) Field of Classification Search
CPC . G03F 7/70708; G03F 7/70875; C03C 27/00; H01L 21/6833; H01L 21/67109; H01L 21/6875; H01L 21/68785
See application file for complete search history.

(56) References Cited

U.S. PATENT DOCUMENTS 7,511,799 B2    3/2009  Tel et al.
9,632,435 B2    4/2017  Ten Kate et al.
(Continued)

FOREIGN PATENT DOCUMENTS

DE    10 2014 008031 A1    12/2015
JP    2002-134599 A    5/2002
(Continued)

OTHER PUBLICATIONS

International Search Report and Written Opinion of the International Searching Authority directed to related International Patent Application No. PCT/EP2020/084727, mailed Mar. 23, 2021; 10 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

Systems, apparatuses, and methods are provided for manufacturing an electrostatic clamp. An example method can include forming, during a first duration of time comprising a first time, a top clamp comprising a first set of electrodes and a plurality of burls. The method can further include forming, during a second duration of time comprising a second time that overlaps the first time, a core comprising a plurality of fluid channels configured to carry a thermally conditioned fluid. The method can further include forming, during a third duration of time comprising a third time that overlaps the first time and the second time, a bottom clamp comprising a second set of electrodes. In some aspects, the
(Continued)

example method can include manufacturing the electrostatic clamp without an anodic bond.

20 Claims, 9 Drawing Sheets

(51) Int. Cl.
  *G03F 7/00* (2006.01)
  *H01L 21/683* (2006.01)

(56) References Cited

U.S. PATENT DOCUMENTS

| | | | |
|---|---|---|---|
| 9,673,737 | B2 | 6/2017 | Baldus |
| 10,719,019 | B2 | 7/2020 | Poiesz et al. |
| 11,281,115 | B2 | 3/2022 | Ten Kate et al. |
| 2005/0127619 | A1 | 6/2005 | Tateno et al. |
| 2006/0102277 | A1 | 5/2006 | Maria Zaal et al. |
| 2009/0168292 | A1 | 7/2009 | Watanabe et al. |
| 2014/0253900 | A1 | 9/2014 | Cornelissen et al. |
| 2015/0036259 | A1* | 2/2015 | Cox ............... H01L 21/6833 361/234 |
| 2015/0103325 | A1 | 4/2015 | Van Der Wilk et al. |
| 2015/0348816 | A1 | 12/2015 | Stein |
| 2015/0370180 | A1* | 12/2015 | Del Puerto ......... G03F 7/70708 355/72 |

FOREIGN PATENT DOCUMENTS

| | | |
|---|---|---|
| JP | 2003-282685 A | 10/2003 |
| JP | 2014-534620 A | 12/2014 |
| JP | 2015-515136 A | 5/2015 |
| JP | 2018-014515 A | 1/2018 |
| TW | 2012-35792 A | 9/2012 |
| TW | 2015-02719 A | 1/2015 |
| WO | WO 2014/122151 A2 | 8/2014 |
| WO | WO 2017/060259 A1 | 4/2017 |

OTHER PUBLICATIONS

Japanese Notice of Reasons for Refusal directed to Japanese Patent Application No. 2022-540655, mailed Sep. 10, 2024; 10 pages.
Japanese Search Report directed to Japanese Patent Application No. 2022-540655, mailed Aug. 30, 2024; 45 pages.

* cited by examiner

SYSTEMS AND METHODS FOR MANUFACTURING A DOUBLE-SIDED ELECTROSTATIC CLAMP

CROSS-REFERENCE TO RELATED APPLICATIONS

This application claims priority of U.S. Provisional Patent Application No. 62/955,489, which was filed on Dec. 31, 2019, and U.S. Provisional Patent Application No. 62/965,101, which was filed on Jan. 23, 2020, both of which are incorporated herein in their entirety by reference.

FIELD

The present disclosure relates to substrate tables and methods for forming burls and nanostructures on substrate table surfaces.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Extreme ultraviolet (EUV) light, for example, electromagnetic radiation having wavelengths of around 50 nanometers (nm) or less (also sometimes referred to as soft x-rays), and including light at a wavelength of about 13 nm, can be used in or with a lithographic apparatus to produce extremely small features in substrates, for example, silicon wafers. Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

Another lithographic system is an interferometric lithographic system where there is no patterning device. Rather, an interferometric lithographic system splits a light beam into two beams and causes the two beams to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate, a dedicated metrology target, or both. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error between two layers formed in or on the patterned substrate. Properties of the substrate can be determined by comparing the properties of an illumination beam before and after the beam has been reflected or scattered by the substrate.

It is desirable to dictate and maintain tribological properties (e.g., friction, hardness, wear) on a surface of a substrate table. In some instances, a wafer clamp may be disposed on the surface of the substrate table. A substrate table, or a wafer clamp attached thereto, has a surface level tolerance that can be difficult to meet because of precision requirements of lithographic and metrology processes. Wafers (e.g., semiconductor substrates), being relatively thin (e.g., <1.0 millimeter (mm) thick) compared to a width of its surface area (e.g., >100.0 mm wide), are particularly sensitive to unevenness of the substrate table. Additionally, ultra-smooth surfaces in contact may become stuck together, which may present a problem when a substrate must be disengaged from the substrate table. To reduce the smoothness of the surface that interfaces with the wafer, the surface of the substrate table or wafer clamp may include glass burls formed by patterning and etching of a glass substrate. However, these glass burls only have a hardness of about 6.0 gigapascals (GPa) and, as a result, can crack during operation of the lithographic apparatus, crushed by particles jammed into the glass burls by the clamped wafers. Further, a conventional clamp typically is manufactured serially using anodic bonds (e.g., to join glass and metal), a process which can take over a year to complete.

SUMMARY

The present disclosure describes various aspects of systems, apparatuses, and methods for manufacturing an electrostatic clamp that includes no anodic bonds via a parallel process that includes forming a top clamp in parallel with forming a core and further in parallel with forming a bottom clamp and subsequently mounting the top clamp to the core and mounting the core to the bottom clamp.

In some aspects, the present disclosure describes a method for manufacturing an apparatus. The method can include forming a top clamp during a first duration of time that includes a first time. The top clamp can include a first surface, a second surface disposed opposite the first surface, a first set of electrodes disposed laterally between the first surface and the second surface, and a plurality of burls disposed over the first surface. The method can further include forming a core during a second duration of time that includes a second time that overlaps the first time. The core can include a third surface, a fourth surface disposed opposite the third surface, a plurality of fluid channels disposed between the third surface and the fourth surface and configured to carry a thermally conditioned fluid. The method can further include forming a bottom clamp during a third duration of time that includes a third time that overlaps the first time and the second time. The bottom clamp can include a fifth surface, a sixth surface disposed opposite the fifth surface, and a second set of electrodes disposed laterally between the fifth surface and the sixth surface.

In some aspects, the present disclosure describes another method for manufacturing an apparatus. The method can include forming, during a first duration of time that includes a first time, a top clamp including a first surface. The method can further include forming, during a second duration of time that includes a second time that overlaps the first time, a core including a second surface and a third surface disposed opposite the second surface. The method can further include forming, during a third duration of time that includes a third time that overlaps the first time and the second time, a bottom clamp including a fourth surface. The method can further include mounting the first surface of the top clamp to the second surface of the core without an anodic bond. The method can further include mounting the third surface of the core to the fourth surface of the bottom clamp without an anodic bond.

In some aspects, the present disclosure describes an apparatus. The apparatus can include a top clamp, a core, and a bottom clamp. The top clamp can include a first set of electrodes and a plurality of burls. The core can include a plurality of fluid channels configured to carry a thermally conditioned fluid. The bottom clamp can include a second set of electrodes. In some aspects, neither the top clamp nor the core nor the bottom clamp includes an anodic bond. In some aspects, the apparatus does not include an anodic bond.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
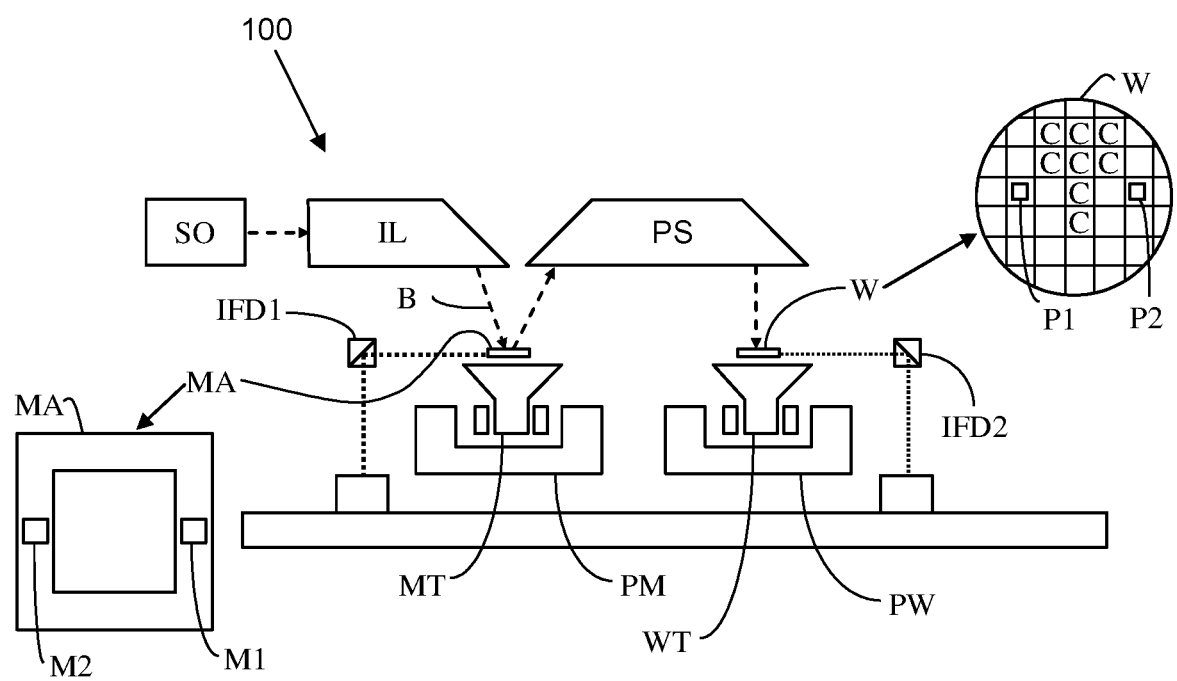
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

Conventional lithographic apparatuses that use an EUV radiation source typically require the EUV radiation beam path, or at least substantial parts of it, to be kept in vacuum during a lithographic operation. In such vacuum regions of the lithographic apparatus, an electrostatic clamp can be used to clamp an object, such as a patterning device (e.g., a mask or reticle) or a substrate (e.g., a wafer), to a structure of the lithographic apparatus, such as a patterning device table or a substrate table, respectively. A conventional electrostatic clamp can include an electrode at one surface of the electrostatic clamp with a plurality of burls disposed on the opposite surface of the electrostatic clamp. As the electrostatic clamp is energized (e.g., using a clamping voltage) and pulls the reticle or wafer in contact with the burls, the conductive burl tops can be at a different potential than the reticle or wafer backside. At the moment of contact, this potential difference causes a discharge mechanism as the two potentials are equalized. Further, conventional electrostatic clamps typically include glass burls formed by patterning and etching of a glass substrate. These glass burls only have a hardness of about 6.0 GPa and, as a result, can crack during operation of the lithographic apparatus, crushed by particles jammed into the glass burls by the clamped wafers. In addition, these conventional electrostatic clamps typically include several anodic bonds and can take upwards of seventy weeks to manufacture, which is far too long.

In contrast to these conventional systems, the present disclosure provides methods for manufacturing an electrostatic clamp that include parallel processing techniques that allow for rapid production and higher yield for the final electrostatic clamp by (i) running critical tasks in parallel and (ii) using an optical bond to join the top clamp to the core so as to have a modular design in which the top clamp can be removed and replaced fairly readily if a burl on the top clamp is broken. The optical bond is strong enough to support the accelerations of electrostatic clamp during operation of a lithographic apparatus but reversible such that the top clamp can be removed and replaced. In addition, the bottom clamp can be removed relatively easily as well by baking the construction (e.g., the core and bottom clamp) to 450 degrees Celsius and ashing the adhesive. Optionally, in some aspects, the electrostatic clamp can be manufactured without an anodic bond, which is non-reversible and contains a high level of stress. However, in other aspects, the electrostatic clamp can be manufactured with one or more anodic bonds, such as an anodic bond to hold the core together and/or an anodic bond between the core and the bottom clamp in combination with an optical bond between the core and the top clamp.

In some aspects, the present disclosure provides methods for manufacturing an electrostatic clamp that includes a top clamp, a core, and a bottom clamp but that does not include any anodic bond. In some aspects described herein, an example method for manufacturing an electrostatic clamp can include forming a top clamp in parallel with forming a core and further in parallel with forming a bottom clamp. Subsequently, the example method can include mounting the top clamp to the core and mounting the core to the bottom clamp. By forming the top clamp, core, and bottom clamp in parallel and without anodic bonding operations, the methods described herein can produce an electrostatic clamp much faster than conventional techniques that utilize serial processes and anodic bonds. For example, while conventional electrostatic clamps can take over a year to manufacture, the electrostatic clamps disclosed herein can take less than three months to manufacture, resulting in a reduction in manufacturing time of about seventy-five percent or more.

Additionally, the present disclosure provides a method for repairing an electrostatic clamp with a top clamp that has been returned from the field for having broken glass burls. The method includes removing the top clamp from the core (e.g., the top clamp may be optically bonded to the core), repairing the broken burls or manufacturing a new top clamp, and optically bonding the new or repaired top clamp to the core, thereby retaining and reusing the existing core and bottom clamp. Accordingly, the present disclosure provides for repairing the electrostatic clamp without discarding all of the elements of its components.

In some aspects, the present disclosure provides for a method to create an electrostatic clamp that is functionally equivalent to conventional wafer clamps but via a process that is both parallel and involves no anodic bonds. Further, the electrostatic clamp disclosed herein can be re-worked much more easily than conventional electrostatic clamps that anodically bond their top clamps to their cores. For example, in-field failures typically involve broken burls on the surface of the top clamp. By optically bonding the top clamp to the core, the electrostatic clamp disclosed herein allows for de-contacting the top clamp from the core and then re-contacting a reworked or newly manufactured top clamp to the core.

In some aspects, the present disclosure provides for a method for manufacturing an electrostatic clamp that includes, among other aspects, the following three parallel production flows.

1. Production of a 0.5 mm thick borosilicate glass clamp for the top clamp. This construct contains electrodes and burls and can be optically contacted to the surface of a polished SiSiC core.
2. Production of an 8.0 mm thick SiSiC core. This construct contains cooling and gas distribution, a polished top surface, and long burls on its backside. In some aspects, the core can be produced without anodic bonds. In other aspects, the core can be produced with one or more anodic bonds.

3. Production of a 0.5 mm thick borosilicate glass clamp for the bottom clamp. This construct contains an electrode and holes through which the core long burls will pass. This bottom clamp can be epoxy bonded to the core.

There are many advantages and benefits to the manufacturing techniques and electrostatic clamps disclosed herein. The present disclosure provides for manufacturing an electrostatic clamp in a manner that is simpler, faster, and cheaper, and with a better production yield, than conventional techniques. Further, the present disclosure provides for repairing an electrostatic clamp in a manner that is simpler, faster, and cheaper, and with a better repair yield, than conventional techniques. For example, the present disclosure provides for manufacturing an electrostatic clamp in a substantially shorter duration of time (e.g., about one-quarter or less of the time required to manufacture a conventional electrostatic clamp) by, among other aspects, forming portions of the electrostatic clamp (e.g., the top clamp, the core, and the bottom clamp) in parallel and without anodic bonding operations. In another example, the present disclosure provides for wafer clamps and electrostatic clamps that include hard burls having a hardness of greater than about 6.0 GPa and, in some aspects, greater than about 20.0 GPa. These hard burls provide for increased wear resistance over traditional glass burls and frictional properties that are conducive to engaging and disengaging a substrate or patterning device during operation of a lithographic apparatus without cracking or breaking. Further, the present disclosure facilitates the re-working of clamps with broken burls that have been returned from the field. As a result of the techniques described in the present disclosure, the related lithographic apparatuses can be returned to service faster, cheaper, and more reliably than with previous techniques. In some aspects, the present disclosure facilitates the return of re-worked clamps to the field with much harder burls that will not so readily break during lithographic operation.

Before describing such aspects in more detail, however, it is instructive to present an example environment in which aspects of the present disclosure can be implemented.

Example Lithographic Systems

Figure 1B:
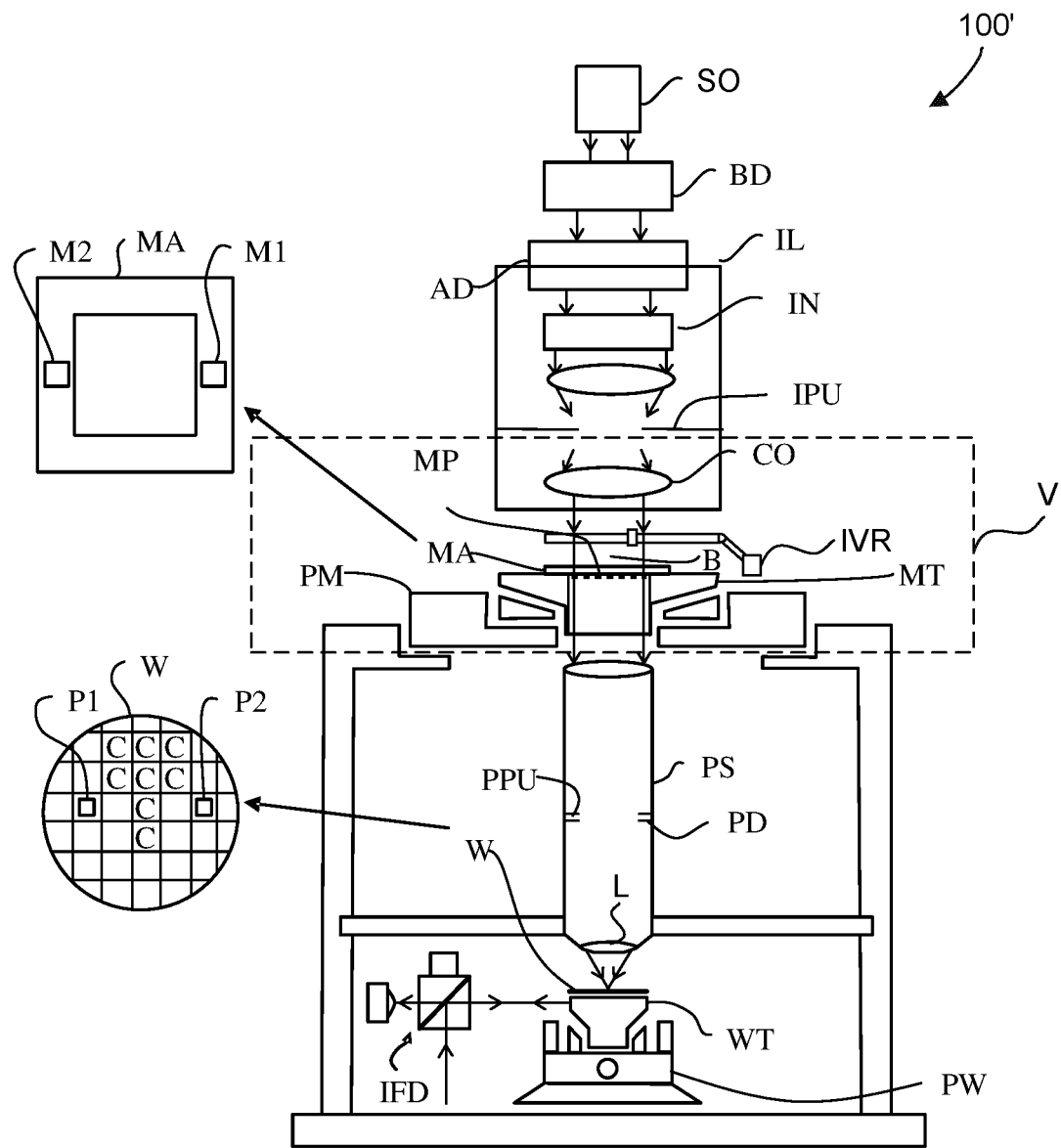
FIG. 1B is a schematic illustration of an example transmissive lithographic apparatus according to some aspects of the present disclosure.

FIGS. 1A and 1B are schematic illustrations of a lithographic apparatus 100 and lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right and the Z-axis points upward), while the patterning device MA and the substrate W are presented from additional points of view (e.g., a top view) that are normal to the XY plane (e.g., the X-axis points to the right and the Y-axis points upward).

Lithographic apparatus 100 and lithographic apparatus 100' each include the following: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system Immersion techniques provide for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

The illumination system IL can include an adjuster AD (e.g., shown in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components (e.g., shown in FIG. 1B), such as an integrator IN and a radiation collector CO (e.g., a condenser or collector optic). The illumination system IL can be used to condition the radiation beam B to have a desired uniformity and intensity distribution in its cross section.

Referring to FIG. 1A, the radiation beam B is incident on the patterning device MA (e.g., a mask), which is held on the support structure MT (e.g., a mask table), and is patterned by the patterning device MA. In lithographic apparatus 100, the radiation beam B is reflected from the patterning device MA. After being reflected from the patterning device MA, the radiation beam B passes through the projection system PS, which focuses the radiation beam B onto a target portion C of the substrate W. With the aid of the second positioner PW and position sensor IFD2 (e.g., an interferometric device, linear encoder, or capacitive sensor), the substrate table WT can be moved accurately (e.g., so as to position different target portions C in the path of the radiation beam B). Similarly, the first positioner PM and another position sensor IFD1 (e.g., an interferometric device, linear encoder, or capacitive sensor) can be used to accurately position the patterning device MA with respect to the path of the radiation beam B. Patterning device MA and substrate W can be aligned using mask alignment marks M1 and M2 and substrate alignment marks P1 and P2.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (e.g., so-called zeroth-order diffracted beams) traverse the pattern without any change in propagation direction. The zeroth-order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth-order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of the illumination system pupil IPU. Further, in some aspects, astigmatism aberration can be reduced by blocking the zeroth-order beams in the pupil conjugate PPU of the projection system associated with radiation poles in opposite quadrants. This is described in more detail in U.S. Pat. No. 7,511,799, issued Mar. 31, 2009, which is incorporated by reference herein in its entirety.

With the aid of the second positioner PW and position sensor IFD (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1B) can be used to accurately position the patterning device MA with respect to the path of the radiation beam B (e.g., after mechanical retrieval from a mask library or during a scan).

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1, M2, and substrate alignment marks P1, P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks can be located between the dies.

Support structure MT and patterning device MA can be in a vacuum chamber V, where an in-vacuum robot IVR can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot IVR. In some instances, both the in-vacuum and out-of-vacuum robots need to be calibrated for a smooth transfer of any payload (e.g., a mask) to a fixed kinematic mount of a transfer station.

The lithographic apparatuses 100 and 100' can be used in at least one of the following modes:
1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-) magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

Combinations and/or variations on the described modes of use or entirely different modes of use can also be employed.

In a further aspect, lithographic apparatus 100 includes an EUV source, which is configured to generate a beam of EUV radiation for EUV lithography. In general, the EUV source is configured in a radiation system, and a corresponding illumination system is configured to condition the EUV radiation beam of the EUV source.

Figure 2:
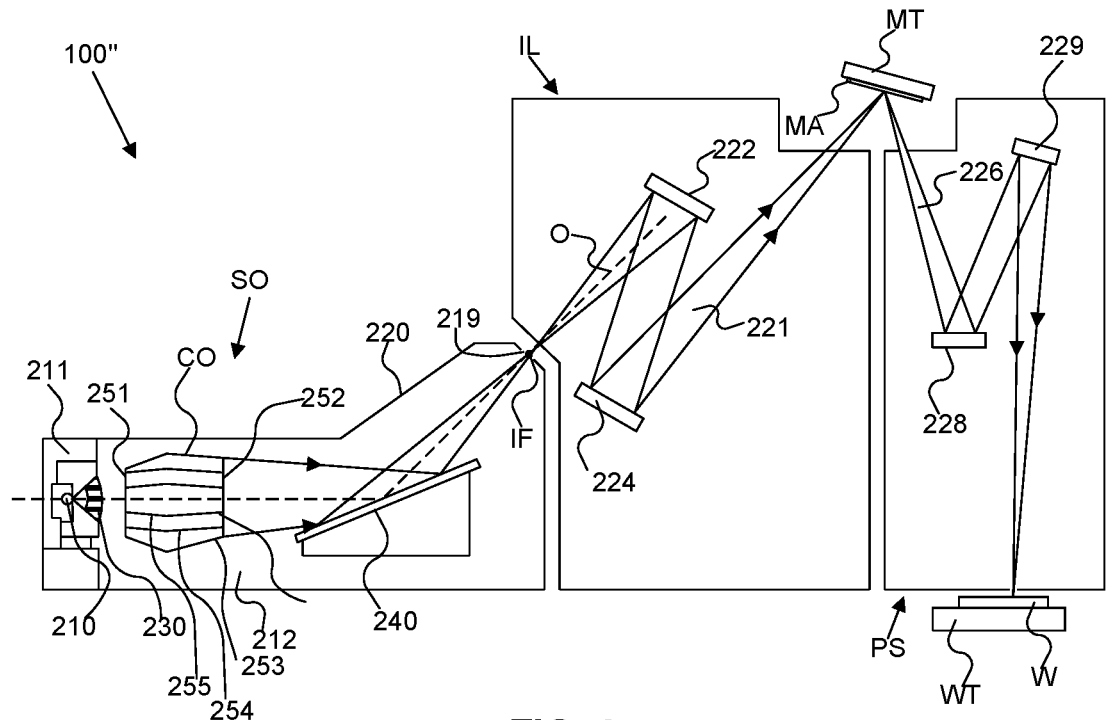
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. Grating spectral filter 240 is used in particular for suppressing infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
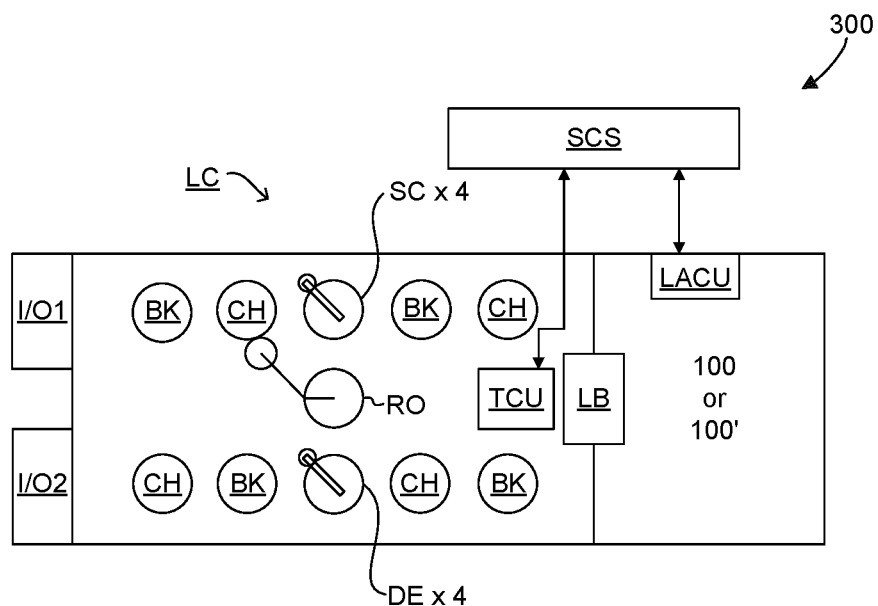
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Substrate Stage

Figure 4:
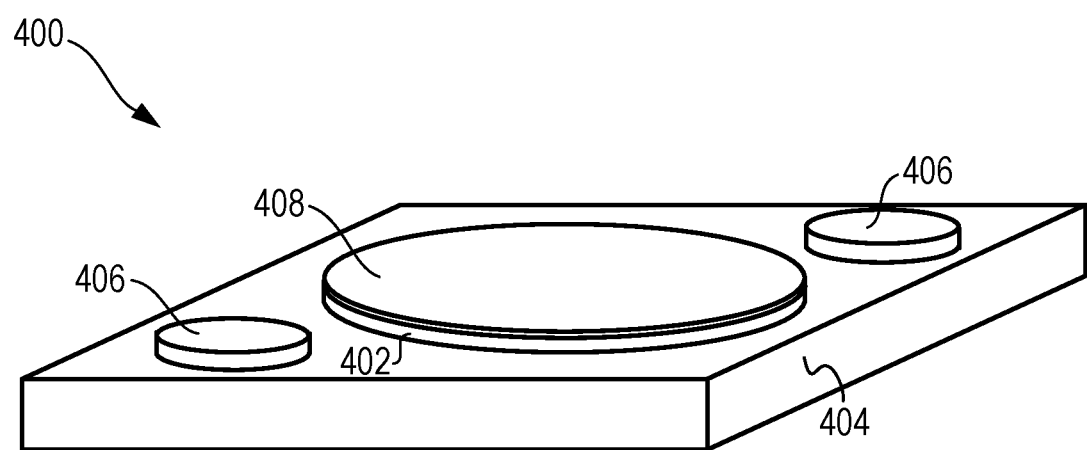
FIG. 4 is a schematic illustration of an example substrate stage according to some aspects of the present disclosure.

FIG. 4 shows a schematic illustration of an example substrate stage 400, according to some aspects of the present disclosure. In some aspects, the example substrate stage 400 can include a substrate table 402, a support block 404, one or more sensor structures 406, any other suitable component, or any combination thereof. In some aspects, substrate table 402 comprises a clamp (e.g., a wafer clamp, a reticle clamp, an electrostatic clamp) to hold a substrate 408. In some aspects, each of one or more sensor structures 406 comprises a transmission image sensor (TIS) plate. The TIS plate is a sensor unit that comprises one or more sensors and/or markers for use in a TIS sensing system used for accurate positioning of the wafer relative to the position of a projection system (e.g., projection system PS described with reference to FIGS. 1A, 1B, and 2) and a mask (e.g., patterning device MA described with reference to FIGS. 1A, 1B, and 2) of a lithographic apparatus (e.g., lithographic apparatus 100 and lithographic apparatus 100' described with reference to FIGS. 1A, 1B, and 2). While TIS plates are shown here for illustration, aspects herein are not limited to any particular sensor. Substrate table 402 is disposed on support block 404. One or more sensor structures 406 are disposed on support block 404.

In some aspects, substrate 408 can be disposed on substrate table 402 when the example substrate stage 400 supports the substrate 408.

The terms "flat," "flatness" or the like can be used herein to describe structures in relation to a general plane of a surface. For example, a bent or unleveled surface can be one that does not conform to a flat plane. Protrusions and recesses on a surface can also be characterized as deviations from a "flat" plane.

The terms "smooth," "roughness" or the like, can be used herein to refer to a local variation, microscopic deviations, graininess, or texture of a surface. For example, the term "surface roughness" can refer to microscopic deviations of the surface profile from a mean line or plane. The deviations are generally measured (in unit of length) as an amplitude parameter, such as root mean squared (RMS) or arithmetical mean deviation (Ra) (e.g., 1 nm RMS).

In some aspects, the surface of the substrate tables mentioned above (e.g., substrate table WT in FIGS. 1A and 1B, substrate table 402 in FIG. 4) can be flat or burled. When the surface of a substrate table is flat, any particulates or contaminants stuck between the substrate table and a wafer will cause the contaminant to print through the wafer, causing lithography errors in its vicinity. Consequently, contaminants reduce device yield rates and increase production costs.

Disposing burls on substrate tables help to reduce the undesirable effects of a flat substrate table. When a wafer is clamped to a burled substrate table, empty spaces are available in the regions where the wafer does not contact the substrate table. The empty spaces function as pockets for contaminants so as to prevent printing errors. Another advantage is that contaminants located on the burls are more likely to become crushed due to the increased load caused by the burls. Crushing contaminants helps mitigate print-through errors as well. In some aspects, the combined surface area of the burls can be approximately one percent to five percent of the surface area of the substrate table. Here, surface area of the burls refers to the surfaces that come into contact with the wafer (e.g., not including the side walls); and surface area of the substrate table refers to the span of surface of the substrate table where the burls reside (e.g., not including the lateral or back side of the substrate table). When the wafer is clamped onto the burled substrate table, the load is increased by 100 fold as compared to a flat substrate table, which is enough to crush most contaminants. Though the example here uses a substrate table, the example is not intended to be limiting. For example, aspects of the present disclosure can be implemented on reticle tables, for a variety of clamping structures (e.g., electrostatic clamps, clamping membranes), and in a variety of lithographic systems (e.g., EUV, DUV).

In some aspects, the burl-to-wafer interface governs the functional performance of the substrate table. When the surface of a substrate table is smooth, an adhesion force can develop between the smooth surface of the substrate table and the smooth surface of a wafer. The phenomenon where two smooth surfaces in contact cling together is known as wringing. Wringing can cause issues (e.g., overlay issues) in device fabrication due to high friction and in-plane stresses in the wafer (it is optimal to have the wafer glide easily during alignment).

Example Surfaces Having Hard Burls

Figure 5:
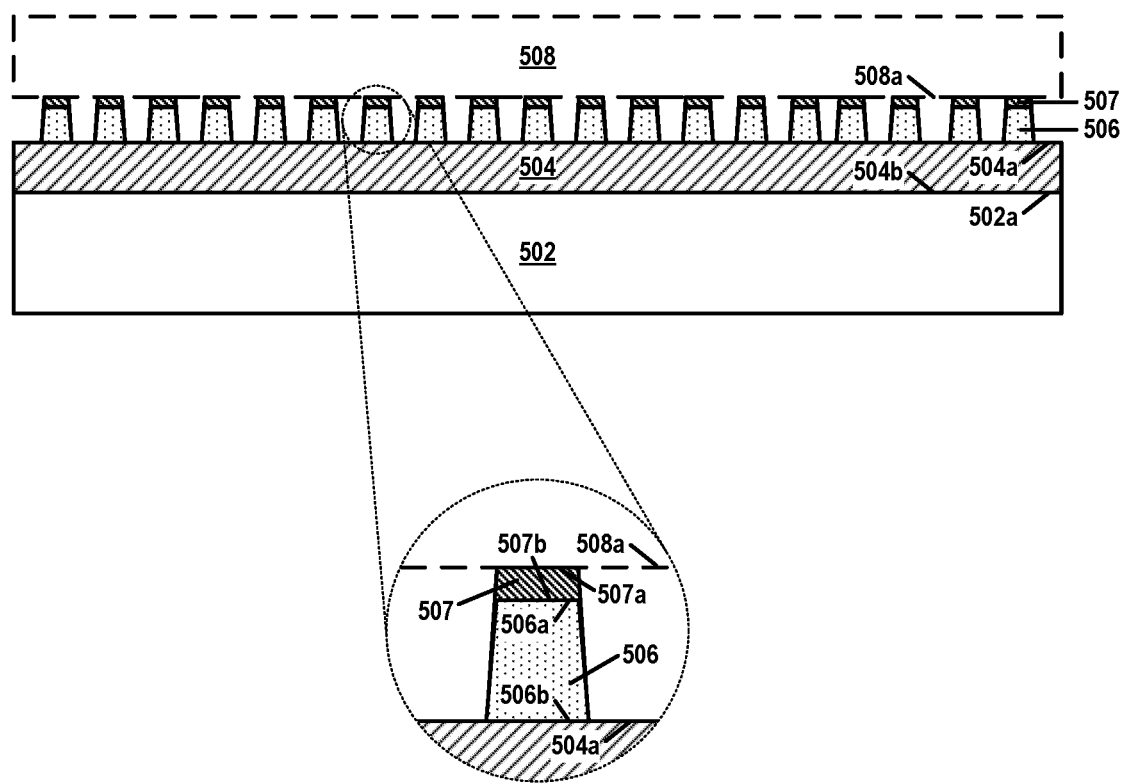
FIG. 5 is a cross-sectional illustration of a region of an example electrostatic clamp according to some aspects of the present disclosure.

FIG. 5 shows a cross-sectional illustration of a region of an example electrostatic clamp 500, such as a portion of a top clamp of the example electrostatic clamp 500 (or, in some aspects, a portion of the example top clamp 702 of the example electrostatic clamp 700 or 701). The example electrostatic clamp 500 can include a first layer 502 (e.g., a glass substrate, a borosilicate glass substrate, an alkaline earth boro-aluminosilicate substrate, a layer of $SiO_2$) including a first surface 502a.

The example electrostatic clamp 500 can further include a second layer 504 (e.g., an adhesion layer such as a layer of Cr, Al, Si, or any other suitable material) including a second surface 504a and a third surface 504b opposite the second surface 504a. The third surface 504b of the second layer 504 can be disposed on the first surface 502a of the first layer 502. In some aspects, the second layer 504 can be patterned as a final, or near final, step.

The example electrostatic clamp 500 can further include a plurality of burls 506 (e.g., DLC burls) disposed over the first surface 502a of the first layer 502. For example, the plurality of burls 506 can be disposed on the second surface 504a of the second layer 504. A hardness of a subset of the plurality of burls 506 can be greater than about 6.0 GPa and, in some instances, greater than about 10.0 GPa, about 15.0 GPa, or even about 20.0 GPa. A thickness of the plurality of burls 506 can be greater than about 2.0 microns and, in some instances, greater than about 5.0 microns, 7.5 microns, or even about 10.0 microns. A radius of each of the plurality of burls 506 can be about 200.0 microns. In some aspects, the plurality of burls 506 can include at least about thirty thousand burls. In some aspects, the plurality of burls 506 can be formed by patterning and etching a third layer (e.g., a DLC layer) to form the plurality of burls 506.

The example electrostatic clamp 500 can further include a plurality of burl tops 507 (e.g., CrN burl tops) disposed over the plurality of burls 506. The plurality of burl tops 507 can be formed by patterning and etching a fourth layer (e.g., a CrN layer) to form the plurality of burl tops 507. In some aspects, the plurality of burls 506, the plurality of burl tops 507, or both can be electrically conductive.

Each burl in the plurality of burls 506 can include a fourth surface 506a and a fifth surface 506b opposite the fourth surface 506a. The fifth surface 506b of the burl can be disposed on the second surface 504a of the second layer 504. Each burl top in the plurality of burl tops 507 can include a sixth surface 507a and a seventh surface 507b opposite the sixth surface 507a. The seventh surface 507b of the burl top can be disposed on the fourth surface 506a of the burl.

Optionally, an object 508 (e.g., a wafer W or a patterning device MA) can be positioned over the plurality of burl tops 507. For example, an eighth surface 508a of the object 508 can be removable disposed (e.g., placed, positioned) on the sixth surface 507a of one or more of the plurality of burl tops 507.

Figure 6:
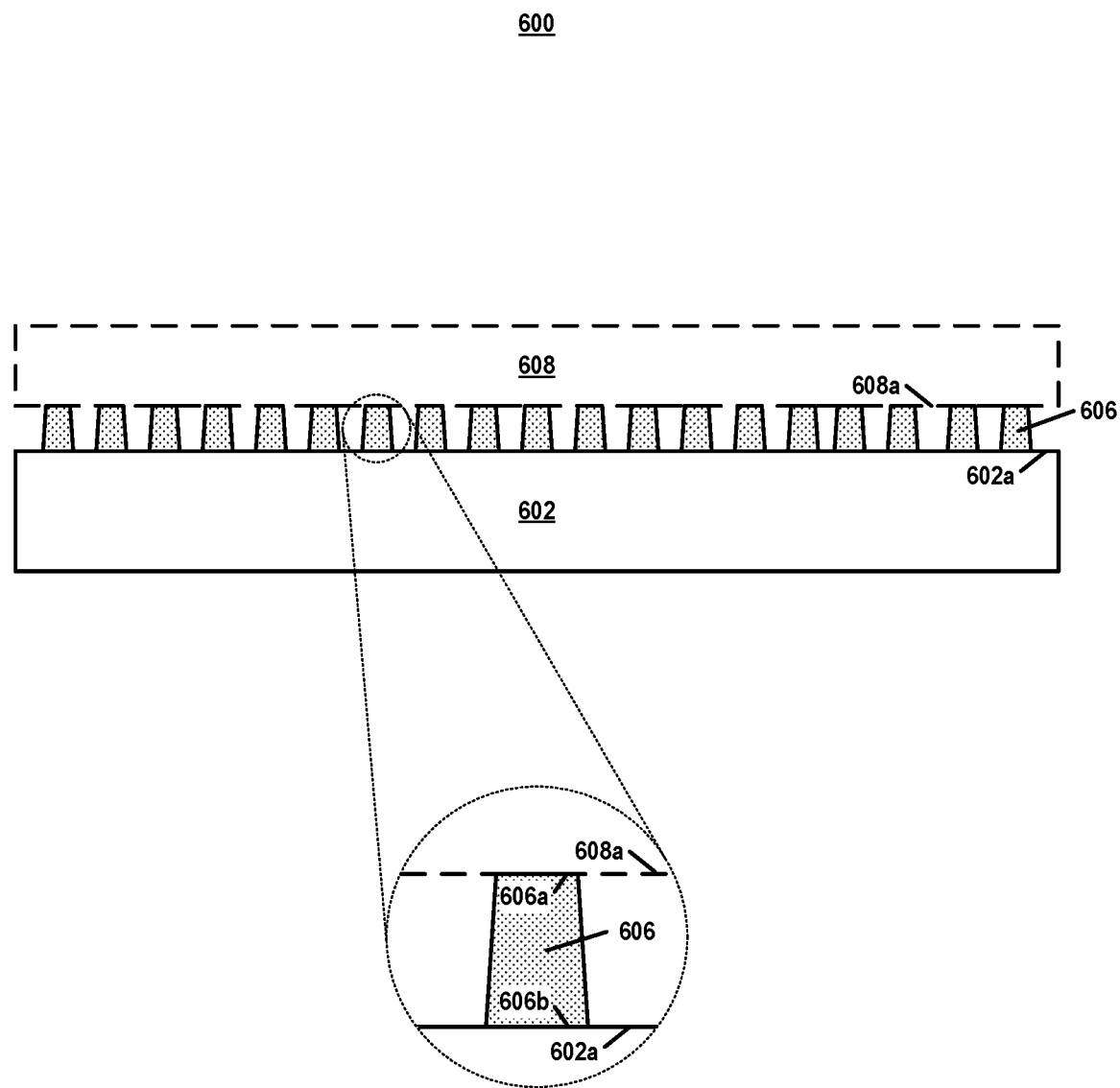
FIG. 6 is a cross-sectional illustration of a region of another example electrostatic clamp according to some aspects of the present disclosure.

FIG. 6 shows a cross-sectional illustration of a region of an example electrostatic clamp 600, such as a portion of a top clamp of the example electrostatic clamp 600 (or, in some aspects, a portion of the example top clamp 702 of the example electrostatic clamp 700 or 701). The example electrostatic clamp 600 can include a first layer 602 (e.g., a glass substrate, a borosilicate glass substrate, an alkaline earth boro-aluminosilicate substrate, a layer of $SiO_2$) including a first surface 602a.

The example electrostatic clamp 600 can further include a plurality of burls 606 (e.g., CrN, AlN, or SiN burls) disposed over the first surface 602a of the first layer 602. For example, the plurality of burls 606 can be disposed on the first surface 602a of the first layer 602. A hardness of a subset of the plurality of burls 606 can be greater than about 6.0 GPa and, in some instances, greater than about 10.0 GPa, about 15.0 GPa, or even about 20.0 GPa. A thickness of the plurality of burls 606 can be greater than about 2.0 microns and, in some instances, greater than about 6.0 microns, 7.5 microns, or even about 10.0 microns. In some aspects, the plurality of burls 606 can include at least about thirty thousand burls. In some aspects, the plurality of burls 606 can be formed by patterning and etching a second layer (e.g., a CrN, AlN, or SiN layer) to form the plurality of burls 606.

Each burl in the plurality of burls 606 can include a second surface 606a and a third surface 606b opposite the second surface 606a. The third surface 606b of the burl can be disposed on the first surface 602a of the first layer 602.

Optionally, an object 608 (e.g., a wafer W or a patterning device MA) can be positioned over the plurality of burls 606. For example, a fourth surface 608a of the object 608 can be removable disposed (e.g., placed, positioned) on the second surface 606a of one or more of the plurality of burls 606. In some aspects, the plurality of burls 606 can be electrically conductive.

Example Electrostatic Clamps

Figure 7A:
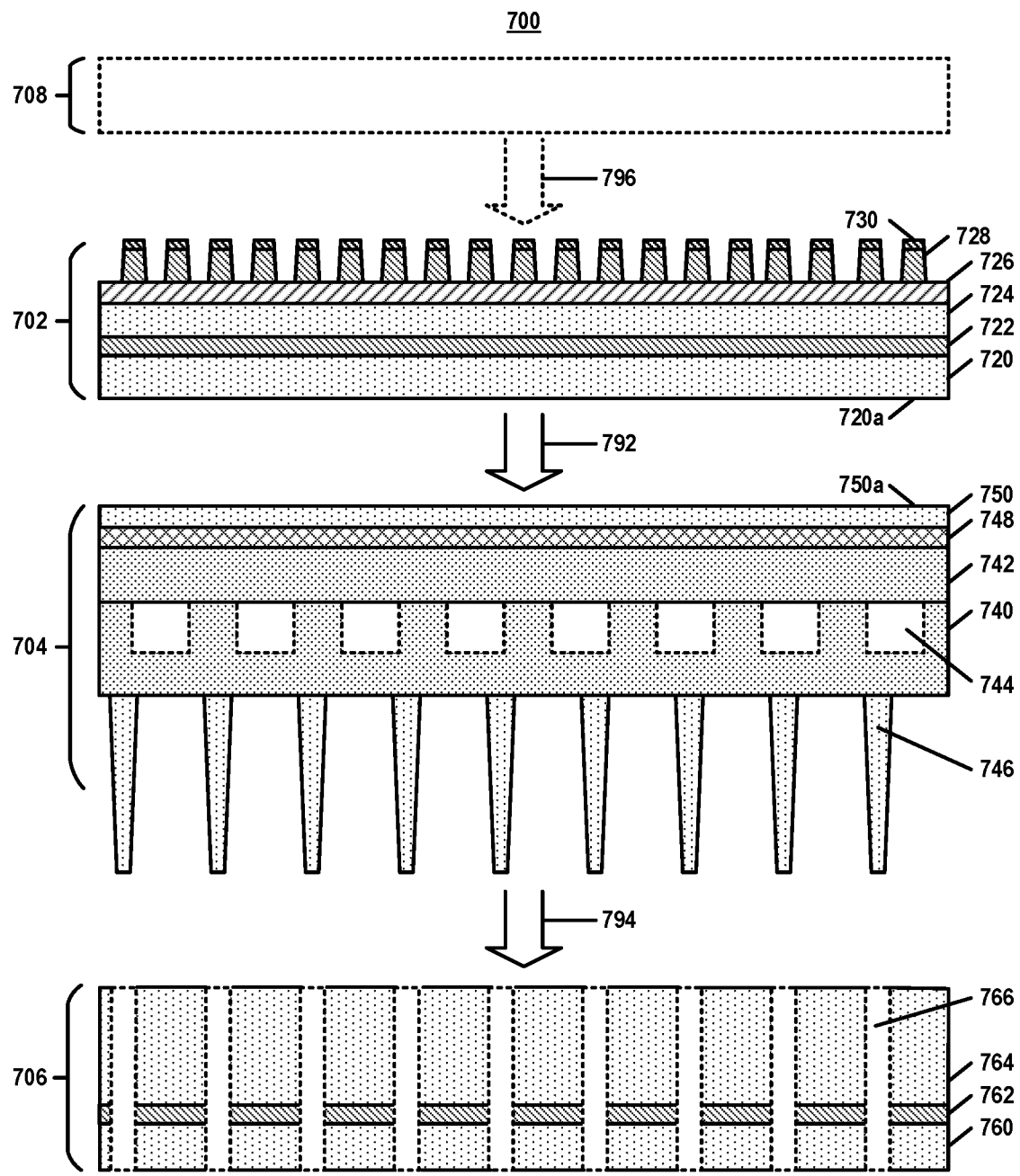
FIG. 7A is a schematic illustration of an exploded cross-sectional view of an example electrostatic clamp according to some aspects of the present disclosure.

FIG. 7A is a schematic illustration of an exploded cross-sectional view of an example electrostatic clamp 700 according to some aspects of the present disclosure. The example electrostatic clamp 700 can include, for example, an example top clamp 702, an example core 704, an example bottom clamp 706, any other suitable component, or any combination thereof. In some aspects, the example electrostatic clamp 700, the example top clamp 702, the example core 704, the example bottom clamp 706, or a combination thereof can be formed without an anodic bond. In some aspects, the example top clamp 702 can have a first thickness of about 0.5 millimeters, the example core 704 can have a second thickness of about 8.0 millimeters, and the example bottom clamp 706 can have a third thickness of about 0.5 millimeters.

The example top clamp 702 can include a layer 720 (e.g., a glass substrate, a borosilicate glass substrate, an alkaline earth boro-aluminosilicate), a layer 724 (e.g., a glass substrate, a borosilicate glass substrate, an alkaline earth boro-aluminosilicate substrate, a layer of $SiO_2$), and one or more layers 722 disposed between the layer 720 and the layer 724 and forming one or more electrodes between the layer 720 and the layer 724. One or more layers 722 can include any combination of the structures, such as one or more composite layers, where each of the one or more composite layers includes one or more electrically conductive layers and one or more insulating layers that are arranged in an alternating configuration.

In some aspects, the layer 724 of the example top clamp 702 can be thinned to a thickness of about 100.0 microns. In some aspects where the layer 724 is thinned to a thickness of less than about 100.0 microns, a layer (e.g., about 5.0 microns) of $SiO_2$ can be deposited on a surface of the layer 724 via vapor deposition (e.g., PECVD). In some aspects wherein the layer 724 is a layer of glass (e.g., borosilicate glass), a first plurality of burls 728 can be can be formed by patterning and etching the layer 724 to form a first plurality of glass burls.

Optionally, the example top clamp 702 can include a layer 726 (e.g., an adhesion layer such as a layer of Cr, Al, Si, or any other suitable material) disposed on a surface of the layer 724 (including, but not limited to, on a surface of a $SiO_2$ layer deposited on the surface of the layer 724). The layer 726 can include any of the aspects described with reference to the second layer 504 or any other suitable layer or material. In some aspects, the layer 726 can be patterned as a final, or near final, step.

The example top clamp 702 can further include a first plurality of burls 728 disposed over the layer 724. In some aspects, the first plurality of burls 728 can be formed of at least one material selected from the group consisting of glass (e.g., $SiO_2$), DLC, AlN, SiN, or CrN. In other aspects, the first plurality of burls 728 can be formed by patterning and etching the layer 724. In some aspects, the first plurality of burls 728 can include any of the aspects described with reference to the plurality of burls 506, the plurality of burls 606, or any other suitable burl or material.

Optionally, the example top clamp 702 can further include a plurality of burl tops 730 disposed over the first plurality of burls 728. In some aspects, the plurality of burl tops 730 can be formed of any suitable material, such as CrN. In some aspects, the plurality of burl tops 730 can include any of the aspects described with reference to the plurality of burl tops 507 or any other suitable burl top or material.

The example core 704 can include a layer 740, a layer 742, and a plurality of fluid channels 744 configured to carry a thermally conditioned fluid. One or both of the layer 740 and the layer 742 can include siliconized silicon carbide (SiSiC) (also referred to as reaction bonded silicon carbide) or any other suitable material having a high stiffness and thermal conductivity.

In some aspects, as shown in FIG. 7A, the plurality of fluid channels 744 can be formed by patterning and etching the layer 740. In other aspects (not shown in FIG. 7A), the plurality of fluid channels 744 can be formed by patterning and etching the layer 742 or any other suitable layer or material.

The example core 704 can further include a layer 748 (e.g., SiC deposited via PECVD or any other suitable technique) and, optionally, a layer 750 (e.g., SiO$_2$ deposited via physical vapor deposition (PVD), PECVD, or any other suitable technique) to enhance optical bonding to the example top clamp 702. In some aspects, the surface of the layer 748 can be polished using a suitable polishing technique, and subsequently the layer 750 can be deposited (e.g., by PVD) on the polished surface of the layer 748. In some aspects, the surface 750a of the layer 750 can be polished using a suitable polishing technique.

The example core 704 can further include a second plurality of burls 746 disposed under the layer 740. In some aspects, the second plurality of burls 746 can be formed by patterning and etching the layer 740. In some aspects, the second plurality of burls 746 can include any of the aspects described with reference to the plurality of burls 506, the plurality of burls 606, the first plurality of burls 728, or any other suitable burl or material. In some aspects, the first plurality of burls 728 can be referred to as "short" burls the second plurality of burls 746 can be referred to as "long" burls. In one illustrative example, a first subset of the first plurality of burls 728 can have a first thickness of about 10.0 microns, and a second subset of the second plurality of burls 746 can have a second thickness of about 1,000 microns. In other words, a thickness of the second plurality of burls 746 can be greater than a thickness of the first plurality of burls 728. In some aspects, the second plurality of burls 728 can include at least about one hundred burls, about 200 burls, or about 300 burls.

The example bottom clamp 706 can include a layer 760 (e.g., a glass substrate, a borosilicate glass substrate, an alkaline earth boro-aluminosilicate), a layer 764 (e.g., a glass substrate, a borosilicate glass substrate, an alkaline earth boro-aluminosilicate substrate, a layer of SiO$_2$), and one or more layers 762 disposed between the layer 760 and the layer 762 and forming one or more electrodes between the layer 760 and the layer 762. One or more layers 762 can include any combination of the structures, such as one or more composite layers, where each of the one or more composite layers includes one or more electrically conductive layers and one or more insulating layers that are arranged in an alternating configuration.

The example bottom clamp 706 can further define a plurality of apertures 766 in the layer 764. The plurality of apertures 766 can be configured to receive the second plurality of burls 746 of the example core 704. In some aspects, the plurality of apertures 766 can be a plurality of holes drilled in the layer 764. In other aspects, the plurality of apertures 766 can be a plurality of openings patterned and etched into the layer 764.

In some aspects, each of the example top clamp 702, the example core 704, and the example bottom clamp 706 can be formed without an anodic bond. In some aspects, the example electrostatic clamp 700 can be formed without an anodic bond by mounting the example top clamp 702 to the example core 704 without an anodic bond, and, previously, simultaneously, or subsequently, mounting the example core 704 to the example bottom clamp 706 without an anodic bond.

In some aspects, as indicated by arrow 792, the example top clamp 702 can be mounted to the example core 704 without an anodic bond. For example, a surface 720a of the example top clamp 702 can be removably attached (e.g., optically bonded) to a surface 750a of the example core 704. The phrases "removably attached" and "removably attaching" can refer to optical bonding or any other suitable reversible or semi-reversible attachment technique. In some aspects, the surface 750a of the example core 704 can be polished before optically bonding the surface 720a of the example top clamp 702 to the surface 750a of the example core 704.

In some aspects, as indicated by arrow 794, the example core 704 can be mounted to the example bottom clamp 706 without an anodic bond. For example, a surface of the example core 704 can be fixably attached to a surface of the example bottom clamp 706. The phrases "fixably attached" and "fixably attaching" can refer to an adhesive bonding technique (e.g., epoxy bonding using a two-part epoxy adhesive), an adhesion technique, a soldering technique, or any other suitable non-reversible attachment technique. In some aspects, each of the second plurality of burls 746 can be inserted into a respective one of the plurality of apertures 766 before adhesively bonding the surface of the example core 704 to the surface of the example bottom clamp 706.

In some aspects, as indicated by arrow 796, the example top clamp 702 can be configured to receive an object 708 (e.g., substrate W or patterning device MA) to be clamped to the example electrostatic clamp 700. The first plurality of burls 728, and in some aspects the plurality of burl tops 730, of the example top clamp 702 can be configured to be in contact with the object 708 during clamping operation. The first plurality of burls 728, and in some instances the plurality of burl tops 730, can help to provide less contaminated contact between the object 708 and the example top clamp 702.

Figure 7B:
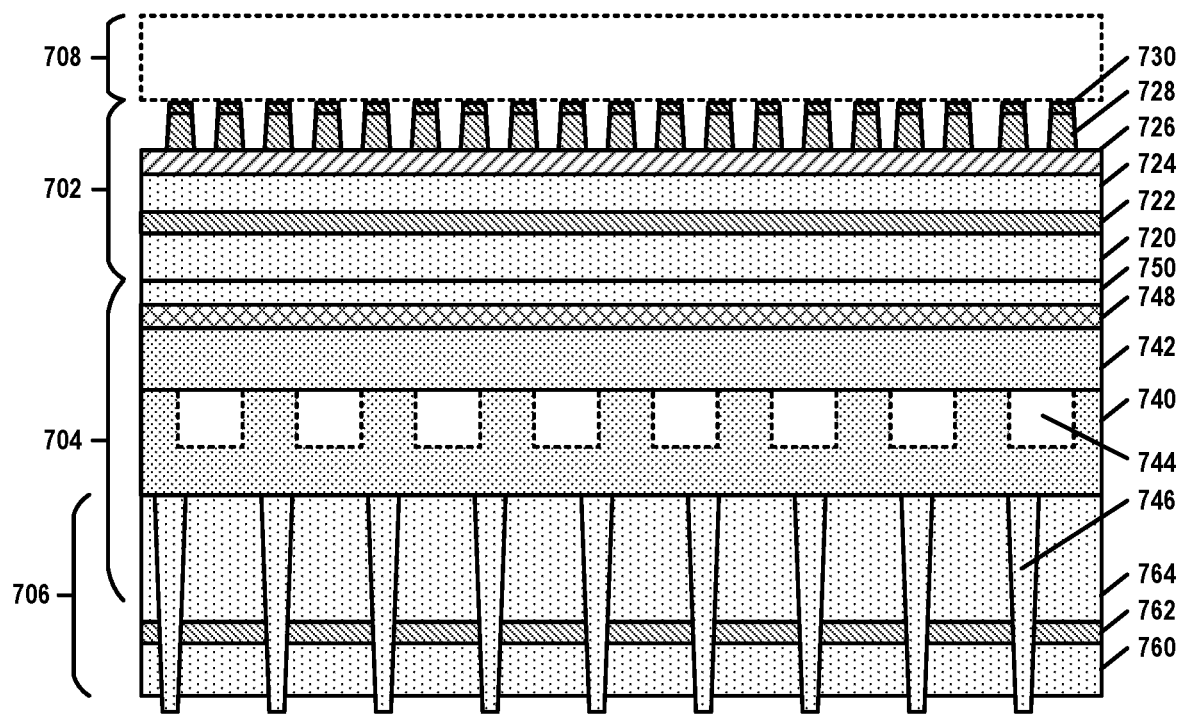
FIG. 7B is a schematic illustration of a cross-sectional view of an example electrostatic clamp according to some aspects of the present disclosure.

FIG. 7B is a schematic illustration of a cross-sectional view of an example electrostatic clamp 701 that has been manufactured according to some aspects of the present disclosure. In some aspects, the example electrostatic clamp 701 can be manufactured without an anodic bond as described above with reference to the example electrostatic clamp 700.

Example Processes for Manufacturing an Electrostatic Clamp

Figure 8:
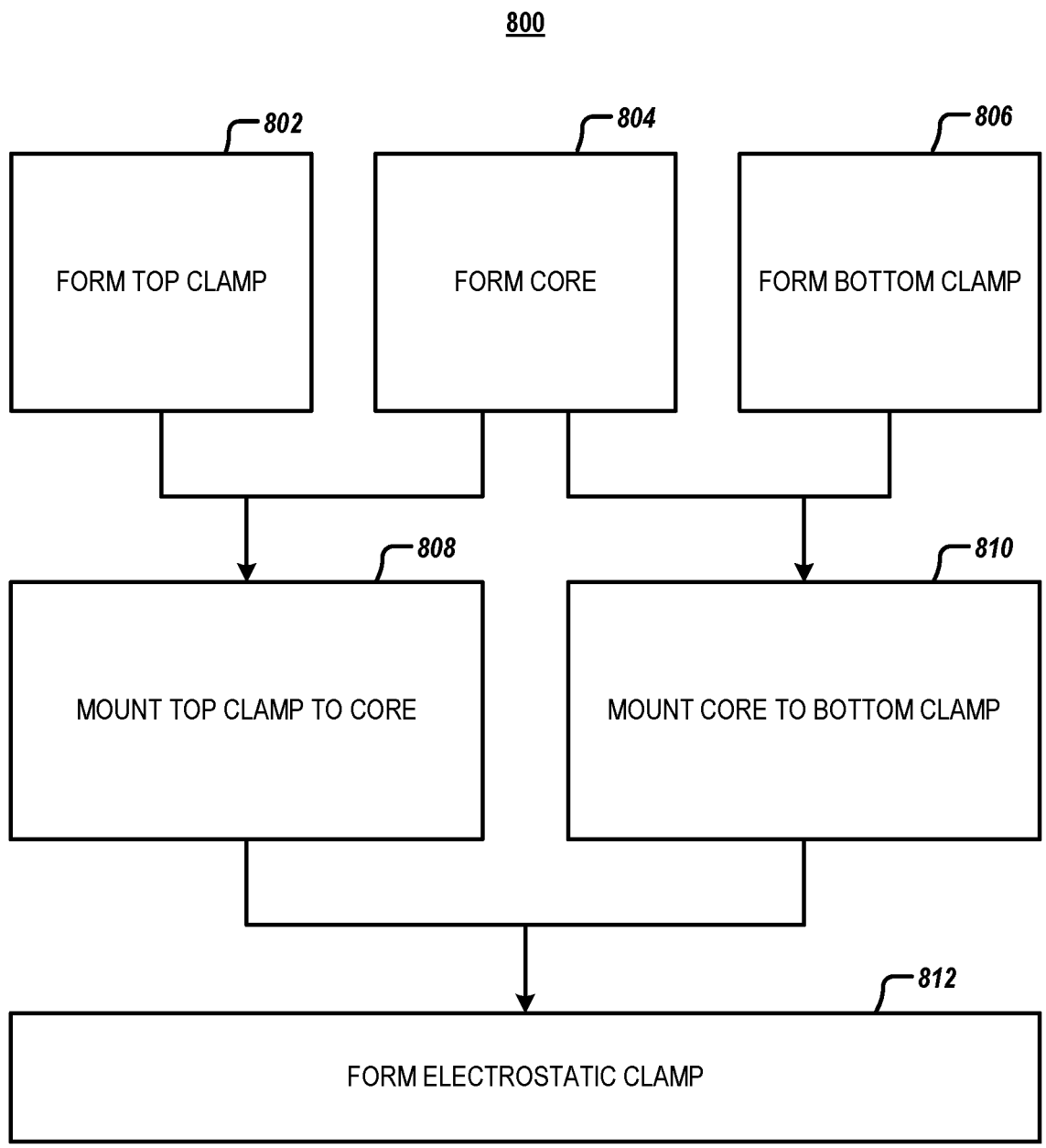
FIG. 8 is an example method for manufacturing an apparatus according to some aspects of the present disclosure or portion(s) thereof.

FIG. 8 is an example method 800 for manufacturing an apparatus according to some aspects of the present disclosure or portion(s) thereof. The operations described with reference to example method 800 can be performed by, or according to, any of the systems, apparatuses, components, techniques, or combinations thereof described herein, such as those described with reference to FIGS. 1-7 above.

At operation 802, the method can include forming a top clamp (e.g., example top clamp 702) during a first duration of time that includes a first time. The top clamp can include a first surface (e.g., a surface of the layer 720, such as the surface 720a), a second surface (e.g., a surface of the layer 724 or the layer 726) disposed opposite the first surface, a first set of electrodes (e.g., one or more electrodes implemented in one or more layers 722) disposed laterally between the first surface and the second surface, and a plurality of burls (e.g., first plurality of burls 728) disposed over the first surface. In some aspects, the forming of the top clamp can include forming the top clamp without an anodic bond. In some aspects, the forming of the top clamp can include forming at least a portion of the top clamp of borosilicate glass. In some aspects, the forming of the top clamp can include forming the top clamp to a thickness of about 0.5 millimeters. In some aspects, the forming of the plurality of burls can include forming the plurality of burls of at least one material selected from the group consisting of $SiO_2$, DLC, AlN, SiN, or CrN. In some aspects, the forming of the top clamp can include forming the top clamp in accordance with any aspect or combination of aspects described with reference to FIGS. 1-7.

At operation 804, the method can include forming a core (e.g., example core 704) during a second duration of time that includes a second time that overlaps the first time. The core can include a third surface (e.g., a surface of the layer 742, the layer 748, or the layer 750, such as the surface 750a), a fourth surface (e.g., a surface of the layer 740 or the second plurality of burls 746) disposed opposite the third surface, and a plurality of fluid channels (e.g., plurality of fluid channels 744) disposed between the third surface and the fourth surface and configured to carry a thermally conditioned fluid. In some aspects, the forming of the core can include forming the core without an anodic bond. In some aspects, the forming of the core can include forming at least a portion of the core of SiSiC. In some aspects, the forming of the core can include forming the core to a thickness of about 8.0 millimeters. In some aspects, to enhance subsequent optical bonding, the forming of the core can include applying a coating (e.g., a layer of $SiO_2$ deposited by PVD) to the polished third surface of the core. In some aspects, the forming of the core can include forming a plurality of burls (e.g., second plurality of burls 746) disposed below the fourth surface. In some aspects, where the plurality of burls formed at operation 802 is a first plurality of burls and the plurality of burls formed at operation 804 is a second plurality of burls, the forming of the top clamp at operation 802 can include forming a first subset of the first plurality of burls to a first thickness (e.g., about 10.0 microns), and the forming of the core at operation 804 can include forming a second subset of the second plurality of burls to a second thickness (e.g., about 1,000.0 microns) that is greater than the first thickness. In some aspects, the forming of the plurality of burls can include forming the plurality of burls from the layer 740, such as by patterning and etching the layer 740. In other aspects, the forming of the plurality of burls can include forming the plurality of burls from a layer (e.g., a glass substrate, a borosilicate glass substrate, an alkaline earth boro-aluminosilicate substrate, a layer of $SiO_2$) disposed on a surface of the layer 740, such as by patterning and etching the layer disposed on the surface of the layer 740. In some aspects, the forming of the core can include forming the core in accordance with any aspect or combination of aspects described with reference to FIGS. 1-7.

At operation 806, the method can include forming a bottom clamp (e.g., example bottom clamp 706) during a third duration of time that includes a third time that overlaps the first time and the second time. The bottom clamp can include a fifth surface (e.g., a surface of the layer 764 or the plurality of apertures 766), a sixth surface (e.g., a surface of the layer 760) disposed opposite the fifth surface, and a second set of electrodes (e.g., one or more electrodes implemented in one or more layers 762) disposed laterally between the fifth surface and the sixth surface. In some aspects, the forming of the bottom clamp can include forming the bottom clamp without an anodic bond. In some aspects, the forming of the bottom clamp can include forming at least a portion of the bottom clamp of borosilicate glass. In some aspects, the forming of the bottom clamp can include forming the bottom clamp to a thickness of about 0.5 millimeters. In some aspects, the bottom clamp can include through-holes (e.g., apertures 766) arranged such that the second plurality of burls disposed on the core pass through the bottom clamp. In some aspects, the surface of the bottom clamp can be about 10 microns from the surface of the second plurality of burls disposed on the core. In other words, the surface of the second plurality of burls can be 10 microns proud of the surface of the bottom clamp. In some aspects, the forming of the bottom clamp can include forming the bottom clamp in accordance with any aspect or combination of aspects described with reference to FIGS. 1-7.

At operation 808, the method can include mounting the second surface of the top clamp to the third surface of the core without an anodic bond. In some aspects, the mounting of the second surface of the top clamp to the third surface of the core can include removably attaching the second surface of the top clamp to the third surface of the core. In some aspects, the removably attaching of the second surface of the top clamp to the third surface of the core can include optically bonding the second surface of the top clamp to the third surface of the core. In some aspects, the method can further include polishing the third surface of the core before the optically bonding of the second surface of the top clamp to the third surface of the core. In some aspects, the mounting of the top clamp to the core can include mounting the top clamp to the core in accordance with any aspect or combination of aspects described with reference to FIGS. 1-7.

At operation 810, the method can include mounting the fourth surface of the core to the fifth surface of the bottom clamp without an anodic bond. In some aspects, the mounting of the fourth surface of the core to the fifth surface of the bottom clamp can include fixably attaching the fourth surface of the core to the fifth surface of the bottom clamp. In some aspects, the fixably attaching of the fourth surface of the core to the fifth surface of the bottom clamp can include adhesive bonding the fourth surface of the core to the fifth surface of the bottom clamp. In some aspects, the adhesive bonding of the fourth surface of the core to the fifth surface of the bottom clamp can include epoxy bonding the fourth surface of the core to the fifth surface of the bottom clamp using a two-part epoxy adhesive. In some aspects, the fixably attaching of the fourth surface of the core to the fifth surface of the bottom clamp can include soldering the fourth surface of the core to the fifth surface of the bottom clamp. In some aspects, the bottom clamp can define a plurality of apertures (e.g., plurality of apertures 766) configured to receive a plurality of burls (e.g., second plurality of burls 746), and the mounting of the fourth surface of the core to the fifth surface of the bottom clamp can include inserting each of the second plurality of burls into a respective one of the plurality of apertures. In some aspects, the mounting of the core to the bottom clamp can include mounting the core to the bottom clamp in accordance with any aspect or combination of aspects described with reference to FIGS. 1-7.

In some aspects, the second plurality of burls can protrude out of layer 760 as shown in FIG. 7B. The protruding second plurality of clamps can be used to contact a movable wafer stage. The structure of the second plurality of burls can be used dictate and maintain tribological properties as described herein. In this manner, when bottom clamp 706 is energized, the entire clamp assembly can clamp onto an actuatable wafer stage such that it can move as one with the wafer stage with specifically engineered tribological interactions therebetween.

At operation 812, the method can include forming an electrostatic clamp (e.g., example electrostatic clamp 701). In some aspects, the forming of the electrostatic clamp can include forming the electrostatic clamp based on the completion of both of operations 808 and 810. In some aspects, the forming of the electrostatic clamp can include forming the electrostatic clamp in accordance with any aspect or combination of aspects described with reference to FIGS. 1-7.

The embodiments may further be described using the following clauses:

1. A method for manufacturing an apparatus, comprising:
    forming, during a first duration of time comprising a first time, a top clamp comprising
        a first surface,
        a second surface disposed opposite the first surface,
        a first set of electrodes disposed laterally between the first surface and the second surface, and
        a plurality of burls disposed over the first surface;
    forming, during a second duration of time comprising a second time that overlaps the first time, a core comprising
        a third surface,
        a fourth surface disposed opposite the third surface,
        a plurality of fluid channels disposed between the third surface and the fourth surface and configured to carry a thermally conditioned fluid; and
    forming, during a third duration of time comprising a third time that overlaps the first time and the second time, a bottom clamp comprising
        a fifth surface,
        a sixth surface disposed opposite the fifth surface, and
        a second set of electrodes disposed laterally between the fifth surface and the sixth surface.

2. The method of clause 1, wherein the forming of the top clamp comprises forming the top clamp without an anodic bond.

3. The method of clause 1, wherein the forming of the core comprises forming the core without an anodic bond.

4. The method of clause 1, wherein the forming of the bottom clamp comprises forming the bottom clamp without an anodic bond.

5. The method of clause 1, wherein the forming of the top clamp comprises forming at least a portion of the top clamp of borosilicate glass.

6. The method of clause 1, wherein the forming of the core comprises forming at least a portion of the core of siliconized silicon carbide (SiSiC).

7. The method of clause 1, wherein the forming of the bottom clamp comprises forming at least a portion of the bottom clamp of borosilicate glass.

8. The method of clause 1, wherein:
    the forming of the top clamp comprises forming the top clamp to a first thickness of about 0.5 millimeters;
    the forming of the core comprises forming the core to a second thickness of about 8.0 millimeters; and
    the forming of the bottom clamp comprises forming the bottom clamp to a third thickness of about 0.5 millimeters.

9. The method of clause 1, wherein the forming of the plurality of burls comprises forming the plurality of burls of at least one material selected from the group consisting of diamond-like carbon (DLC), aluminum nitride (AlN), silicon nitride (SiN), or chromium nitride (CrN).

10. The method of clause 1, further comprising mounting the second surface of the top clamp to the third surface of the core without an anodic bond.

11. The method of clause 10, wherein the mounting of the second surface of the top clamp to the third surface of the core comprises removably attaching the second surface of the top clamp to the third surface of the core.

12. The method of clause 11, wherein the removably attaching of the second surface of the top clamp to the third surface of the core comprises optically bonding the second surface of the top clamp to the third surface of the core.

13. The method of clause 12, further comprising polishing the third surface of the core before the optically bonding of the second surface of the top clamp to the third surface of the core.

14. The method of clause 1, wherein:
    the plurality of burls is a first plurality of burls;
    the forming of the core comprises forming a second plurality of burls disposed below the fourth surface;
    the forming of the top clamp comprises forming a first subset of the first plurality of burls to a first thickness; and
    the forming of the core comprises forming a second subset of the second plurality of burls to a second thickness greater than the first thickness.

15. The method of clause 14, further comprising mounting the fourth surface of the core to the fifth surface of the bottom clamp without an anodic bond, wherein:
    the bottom clamp defines a plurality of apertures configured to receive the second plurality of burls; and
    the mounting of the fourth surface of the core to the fifth surface of the bottom clamp comprises inserting each of the second plurality of burls into a respective one of the plurality of apertures.

16. The method of clause 1, wherein the mounting of the fourth surface of the core to the fifth surface of the bottom clamp comprises fixably attaching the fourth surface of the core to the fifth surface of the bottom clamp.

17. The method of clause 16, wherein the fixably attaching of the fourth surface of the core to the fifth surface of the bottom clamp comprises adhesive bonding the fourth surface of the core to the fifth surface of the bottom clamp.

18. The method of clause 17, wherein the adhesive bonding of the fourth surface of the core to the fifth surface of the bottom clamp comprises epoxy bonding the fourth surface of the core to the fifth surface of the bottom clamp using a two-part epoxy adhesive.

19. A method for manufacturing an apparatus, comprising:
    forming, during a first duration of time comprising a first time, a top clamp comprising a first surface;
    forming, during a second duration of time comprising a second time that overlaps the first time, a core comprising a second surface and a third surface disposed opposite the second surface;
    forming, during a third duration of time comprising a third time that overlaps the first time and the second time, a bottom clamp comprising a fourth surface;

mounting the first surface of the top clamp to the second surface of the core without an anodic bond; and mounting the third surface of the core to the fourth surface of the bottom clamp without an anodic bond.

20. An apparatus comprising:
a top clamp comprising a first set of electrodes and a plurality of burls;
a core comprising a plurality of fluid channels configured to carry a thermally conditioned fluid; and
a bottom clamp comprising a second set of electrodes,
wherein the top clamp does not include an anodic bond,
wherein the core does not include an anodic bond, and
wherein the bottom clamp does not include an anodic bond.

CONCLUSION

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A method for manufacturing an apparatus, comprising:
forming, during a first duration of time comprising a first time, a top clamp comprising:
a first surface,
a second surface disposed opposite the first surface,
a first set of electrodes disposed laterally between the first surface and the second surface, and
a plurality of burls disposed over the first surface;
forming, during a second duration of time comprising a second time that overlaps the first time, a core comprising:
a third surface,
a fourth surface disposed opposite the third surface,
a plurality of fluid channels disposed between the third surface and the fourth surface and configured to carry a thermally conditioned fluid; and
forming, during a third duration of time comprising a third time that overlaps the first time and the second time, a bottom clamp comprising:
a fifth surface,
a sixth surface disposed opposite the fifth surface, and
a second set of electrodes disposed laterally between the fifth surface and the sixth surface.

2. The method of claim 1, wherein the forming of the top clamp comprises forming the top clamp without an anodic bond.

3. The method of claim 1, wherein the forming of the core comprises forming the core without an anodic bond.

4. The method of claim 1, wherein the forming of the bottom clamp comprises forming the bottom clamp without an anodic bond.

5. The method of claim 1, wherein the forming of the top clamp comprises forming at least a portion of the top clamp of borosilicate glass.

6. The method of claim 1, wherein the forming of the core comprises forming at least a portion of the core of siliconized silicon carbide (SiSiC).

7. The method of claim 1, wherein the forming of the bottom clamp comprises forming at least a portion of the bottom clamp of borosilicate glass.

8. The method of claim 1, wherein:
the forming of the top clamp comprises forming the top clamp to a first thickness of about 0.5 millimeters;
the forming of the core comprises forming the core to a second thickness of about 8.0 millimeters; and
the forming of the bottom clamp comprises forming the bottom clamp to a third thickness of about 0.5 millimeters.

9. The method of claim 1, wherein the forming of the plurality of burls comprises forming the plurality of burls of at least one material selected from a group consisting of diamond-like carbon (DLC), aluminum nitride (AlN), silicon nitride (SiN), or chromium nitride (CrN).

10. The method of claim 1, further comprising mounting the second surface of the top clamp to the third surface of the core without an anodic bond.

11. The method of claim 10, wherein the mounting of the second surface of the top clamp to the third surface of the core comprises removably attaching the second surface of the top clamp to the third surface of the core.

12. The method of claim 11, wherein the removably attaching of the second surface of the top clamp to the third surface of the core comprises optically bonding the second surface of the top clamp to the third surface of the core.

13. The method of claim 12, further comprising polishing the third surface of the core before the optically bonding of the second surface of the top clamp to the third surface of the core.

14. The method of claim 1, wherein:
the plurality of burls is a first plurality of burls;
the forming of the core comprises forming a second plurality of burls disposed below the fourth surface;
the forming of the top clamp comprises forming a first subset of the first plurality of burls to a first thickness; and
the forming of the core comprises forming a second subset of the second plurality of burls to a second thickness greater than the first thickness.

15. The method of claim 14, further comprising mounting the fourth surface of the core to the fifth surface of the bottom clamp without an anodic bond, wherein:
the bottom clamp defines a plurality of apertures configured to receive the second plurality of burls; and
the mounting of the fourth surface of the core to the fifth surface of the bottom clamp comprises inserting each of the second plurality of burls into a respective one of the plurality of apertures.

16. The method of claim 1, wherein the mounting of the fourth surface of the core to the fifth surface of the bottom clamp comprises fixably attaching the fourth surface of the core to the fifth surface of the bottom clamp.

17. The method of claim 16, wherein the fixably attaching of the fourth surface of the core to the fifth surface of the bottom clamp comprises adhesive bonding the fourth surface of the core to the fifth surface of the bottom clamp.

18. The method of claim 17, wherein the adhesive bonding of the fourth surface of the core to the fifth surface of the bottom clamp comprises epoxy bonding the fourth surface of the core to the fifth surface of the bottom clamp using a two-part epoxy adhesive.

19. A method for manufacturing an apparatus, comprising:
forming, during a first duration of time comprising a first time, a top clamp comprising a first surface;
forming, during a second duration of time comprising a second time that overlaps the first time, a core comprising a second surface and a third surface disposed opposite the second surface;
forming, during a third duration of time comprising a third time that overlaps the first time and the second time, a bottom clamp comprising a fourth surface;
mounting the first surface of the top clamp to the second surface of the core without an anodic bond; and
mounting the third surface of the core to the fourth surface of the bottom clamp without an anodic bond.

20. An apparatus comprising:
a top clamp comprising a first set of electrodes and a first plurality of burls;
a core comprising a plurality of fluid channels configured to carry a thermally conditioned fluid and a second plurality of burls, the second plurality of burls disposed below a bottom surface of the core; and
a bottom clamp comprising a second set of electrodes and a plurality of apertures, the plurality of apertures configured to receive respective ones of the second plurality of burls,
wherein the top clamp does not include an anodic bond,
wherein the core does not include an anodic bond,
wherein the bottom clamp does not include an anodic bond, and
wherein the bottom surface of the core is mounted to a top surface of the bottom clamp without an anodic bond.

* * * * *